United States Patent [19]
Baumgartner et al.

[11] 4,024,525
[45] May 17, 1977

[54] BRUSH WEAR INDICATOR

[75] Inventors: Kenneth A. Baumgartner, Peoria, Ill.; Ward L. Bivens, Painesville, Ohio

[73] Assignee: Towmotor Corporation, Mentor, Ohio

[22] Filed: Jan. 7, 1976

[21] Appl. No.: 647,295

[52] U.S. Cl. .................. 340/267 R; 200/61.41; 310/245; 340/248 E; 340/282

[51] Int. Cl.² ........................................ G08B 21/00

[58] Field of Search .......... 340/267 R, 248 E, 282; 200/61.41, 164 R; 318/409; 310/239, 245

[56] References Cited
UNITED STATES PATENTS

| | | | |
|---|---|---|---|
| 391,554 | 10/1888 | Field | 188/22 |
| 1,251,827 | 1/1918 | Schweitzer | 310/239 |
| 1,277,394 | 9/1918 | Dean | 310/246 |
| 1,588,087 | 6/1926 | Billingsley | 340/267 |
| 1,966,057 | 7/1934 | Winkel | 310/167 |
| 2,590,796 | 3/1952 | Schaffer | 340/267 |
| 2,691,114 | 10/1954 | Lykins | 310/246 |
| 2,813,208 | 11/1957 | Ritter | 310/247 |
| 3,523,288 | 8/1970 | Thompson | 340/267 |

*Primary Examiner*—Glen R. Swann, III
*Attorney, Agent, or Firm*—Phillips, Moore, Weissenberger, Lempio & Majestic

[57] ABSTRACT

A brush which presses against the commutator of a direct current machine has a groove in one side thereof into which a fixed probe partially extends. As the brush wears, movement thereof causes physical engagement of the probe with the end of the groove to complete a current path through the probe. Flow through the current path energizes and latches a warning device.

17 Claims, 8 Drawing Figures

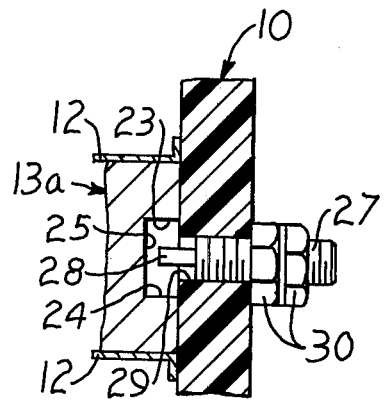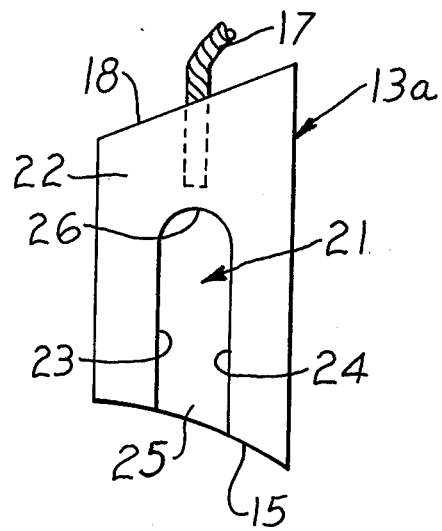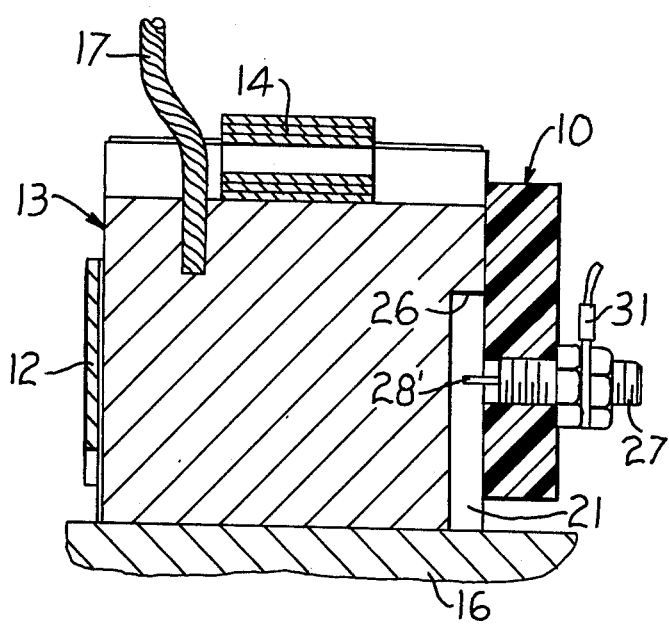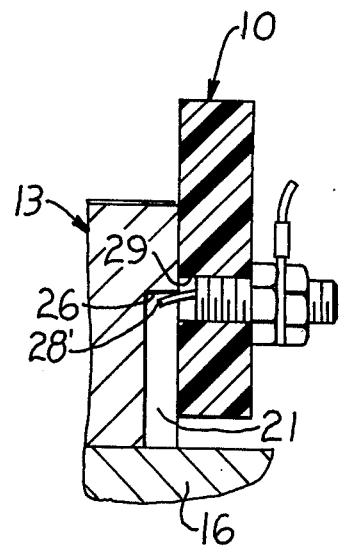

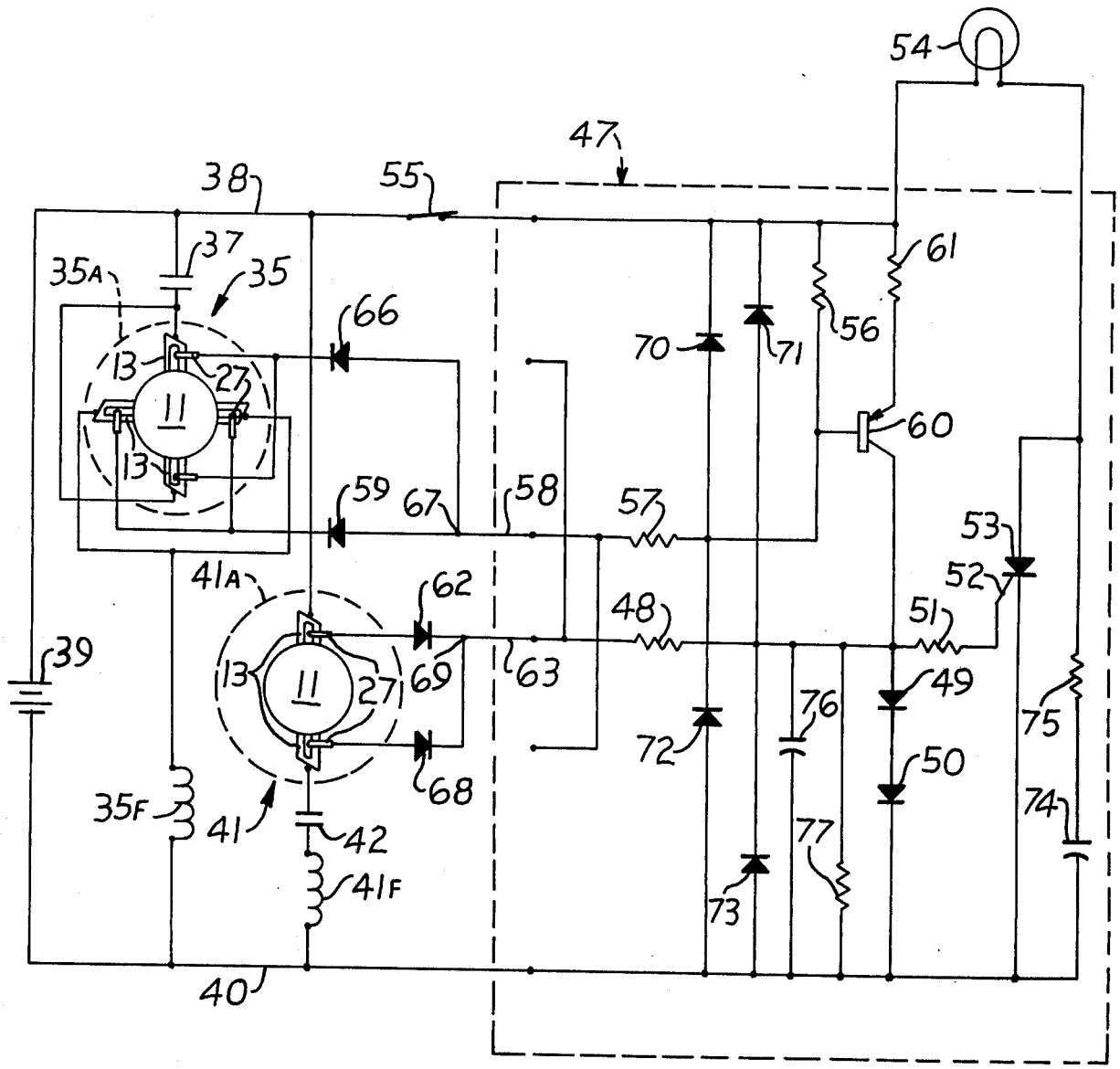
Fig_8

BRUSH WEAR INDICATOR

BACKGROUND OF THE INVENTION

Direct current machines, i.e., motors or generators, have a commutator fixed to the rotating armature and electrically connected to the armature windings, the armature being electrically connected to an external power circuit through brushes which engage the rotating commutator. The brushes are usually made of a mixture of carbon particles and a binder material such as graphite or a metallic powder. As the commutator rotates, the contact faces of the brushes gradually wear away. In order to maintain electrical contact the brushes are slidably mounted in stationary brush holders on a yoke surrounding the commutator, the brushes being spring-pressed into engagement with the commutator. Wearing of the brushes causes them to shorten in length and eventually they must be replaced. If a brush is allowed to wear too much before replacement, the metal securement of the pigtail connection to the brush will engage the commutator and cause detrimental scoring thereof.

It is the object of this invention to provide an improved means of detecting the amount of wear of a brush and for giving a warning signal when a predetermined amount of brush wear has occurred.

SUMMARY OF THE INVENTION

The brushes are formed with a groove in one side which has a terminating end spaced a predetermined distance from the end of the brush opposite to the contact face thereof. A stationary electrically conductive probe extends into the groove but does not touch the sides or the bottom of the groove so that there is normally no physical or electrical contact between the probe and the brush. As the brush wears, it will feed past the probe until eventually the terminating end of the groove engages the probe and makes electrical contact between the probe and the brush. The voltage potential on the brush is then applied to the probe and current can flow through a control circuit current path to the power line of opposite potential. This current is utilized to develop a voltage which is utilized to energize a warning signal.

In order to maintain the warning signal energized, even though the voltage potential on the probe thereafter ceases, a normally open switch device is used in the energizing circuit for the warning signal, the switch being closed upon initial flow of current through the current path and remaining closed even though current thereafter ceases to flow through the current path. Preferably a silicon controlled rectifier is used as the switch device.

Separate current paths are provided for probes associated with opposite polarity brushes when it is desired to indicate brush wear of any brush while the machine is energized. When it is desired to indicate brush wear upon de-energization of the machine, the probes associated with brushes of opposite polarity are connected together by back-to-back diodes and a single current path from the junction of the diodes is used to indicate wear of any brush.

Other objects and advantages will become apparent in the course of the following detailed description.

BRIEF DESCRIPTION OF THE DRAWINGS

In the drawings, forming a part of this application, and in which like parts are designated by like reference numerals throughout the same.

FIG. 3 is a sectional detail of the present invention, taken on line III—III of FIG. 2;

FIG. 4 is an end view of one of the brushes, illustrating the groove formed in an end thereof;

FIG. 5 is a sectional view, similar to FIG. 2, illustrating a modification of the invention utilizing a single brush and a resilient probe;

FIG. 6 is a detail view showing engagement of the groove of the brush of FIG. 5 with the resilient probe;

FIG. 8 is a circuit diagram of an indicator system using a single line from each motor to the control circuit for the warning indicator.

DESCRIPTION OF THE PREFERRED EMBODIMENTS

Figure 1:
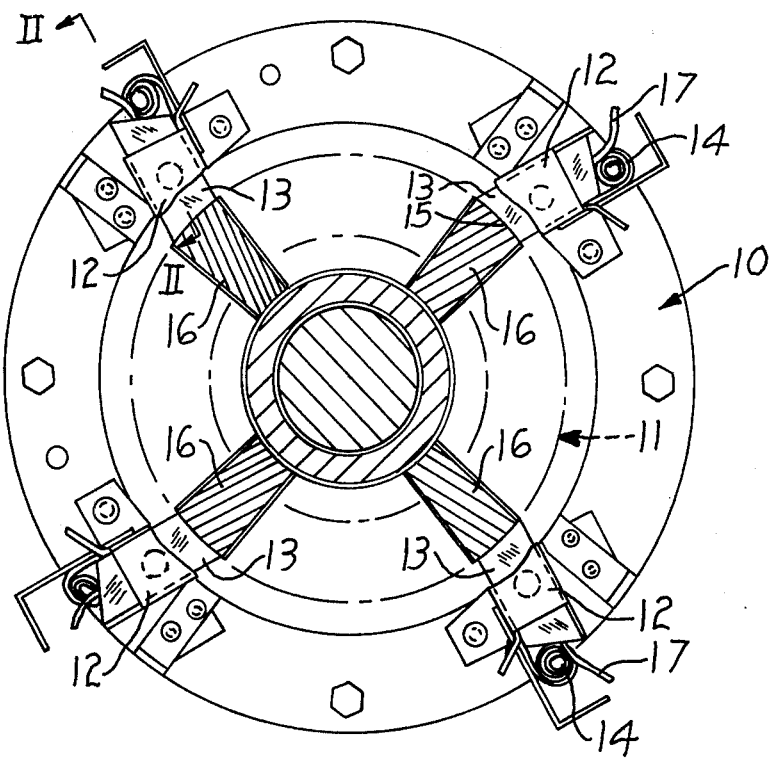
FIG. 1 is a view, partly in section, of a typical commutator and yoke arrangement for a direct current machine with brushes disposed in brush holders.

Referring now to FIGS. 1–4, a conventional electrically nonconductive yoke 10 surrounds the commutator 11 and is mounted in fixed relationship thereto by means not shown. A plurality of brush holders 12 are mounted on the yoke and brush means 13 are mounted therein for sliding translatory movement towards the commutator. Springs 14 press the brushes towards the commutator so that the contact faces 15 of the brushes engage and make electrical contact with the commutator bars 16. Alternate brushes are of opposite polarity, and, in multipolar machines, brushes of like polarity are electrically connected together.

Figure 2:
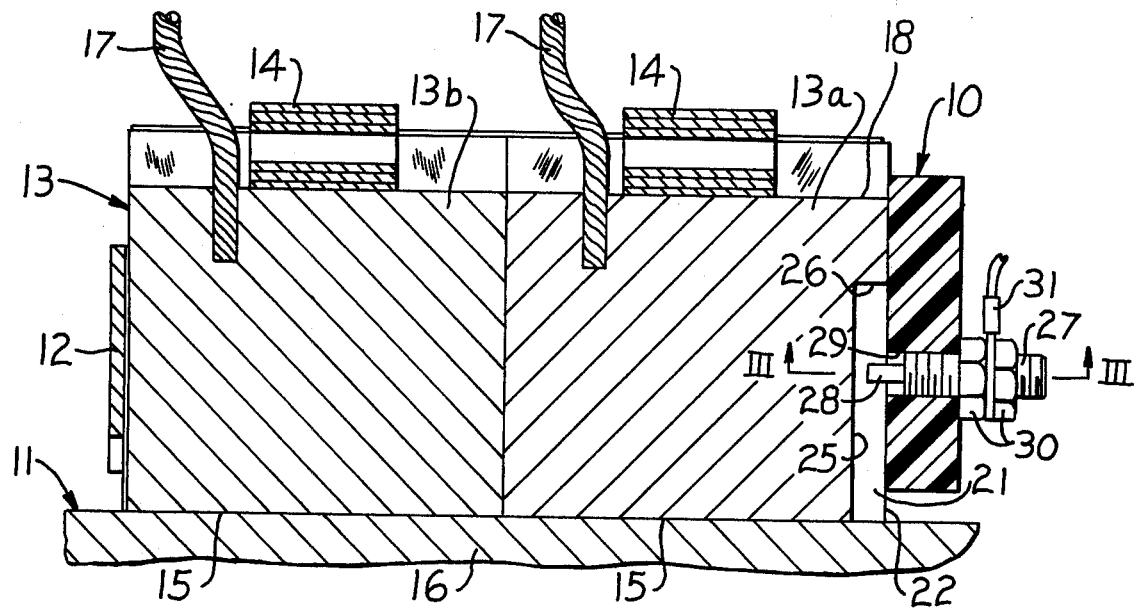
FIG. 2 is a sectional view, taken on line II—II of FIG. 1, illustrating the relationship of the brush groove and probe according to the present invention.

As best seen in FIG. 2, each brush means 13 may comprise two separate brushes 13a and 13b mounted, side by side, in each brush holder 12 for individually sliding movement therein. Each brush has a pigtail lead 17 secured thereto, as for example by insertion of the end of the pigtail into a bore into the end 18 of the brush opposite to the contact face 15.

As seen in FIG. 4, the brush 13a has an elongated groove 21 formed in one side 22 thereof, the groove having side walls 23 and 24, a bottom 25 and a terminating end 26 spaced from the brush end 18. Groove 21 extends from the terminating end 26 towards the contact face 15 and in the direction of translatory movement of the brush in the brush holder.

An electrically conductive probe 27 is mounted in the yoke adjacent each brush (FIGS. 2 and 3), the probe having an end portion 28 extending into groove 21, the end portion 28 being spaced from the sides 23 and 24 and bottom 25 of the groove during translatory movement of the brush in the holder but being engageable with the terminating end 26 of the groove. Preferably probe 27 is a threaded stud with a reduced-diameter end portion 28, the stud being threaded into threaded holes 29 in the yoke and held in place by nuts 30 which also hold lead terminal 31 in place.

Since the groove 21 extends completely to the contact face 15, as shown in FIGS. 2 and 4, the brushes 13a and 13b can be simply inserted and slid into place in the brush holder in a conventional manner. During operation of the machine the contact faces 15 of the brushes will wear away, and the brushes will be fed into the brush holders by springs 14 so that contact is maintained with the commutator. In due course, wearing of the contact face of brush 13a will cause the brush to shorten to such an extent that the terminating end 26 of the groove 21 will engage the end portion 28 of probe 27 and make electrical contact therewith. The extent of movement of brush 13a in holder 12 towards the commutator is determined by the location of the probe on the yoke and the spacing of the terminating end of groove 21 from the brush end 18. Engagement of the probe with the terminating end of the groove will prevent further movement of brush 13a into the brush holder. Excessive sparking, however, will be prevented since sliding progress of brush 13b into the brush holder is not stopped and brush 13b will continue to be pressed into engagement with the commutator.

FIGS. 5 and 6 show a modification of the invention usable with a double brush system but particularly suitable for a brush system wherein each brush means 13 comprises a single brush mounted in the brush holders 12. In this embodiment the end portion 28' of probe 27 comprises an elongated resilient and laterally deflectable whisker or blade affixed to the end of the threaded stud portion of the probe. As the brush 13 wears it will be fed towards the commutator 16 and the terminating end 26 of groove 21 will eventually come into engagement with the end portion 28' of the probe and make electrical contact as before. Providing that the force required to deflect the resilient end portion 28' is sufficiently less than the force exerted on the brush by spring 14, the end portion 28' will deflect, as in FIG. 6, and the brush will continue to be fed towards the commutator without significant impediment, remaining in engagement therewith to prevent excessive sparking. In due course the resilient end portion 28' will be deflected sufficiently so that it engages the wall of hole 29. At such time the end portion 28' will cease to deflect and will prevent the brush 13 from moving further towards the commutator thereby preventing the pigtail 17 from contacting and scoring the commutator. Thus, a time delay period is provided for brush replacement between initial contact of the probe and stoppage of the brush, during which time the brush will continue to function normally.

Figure 7:
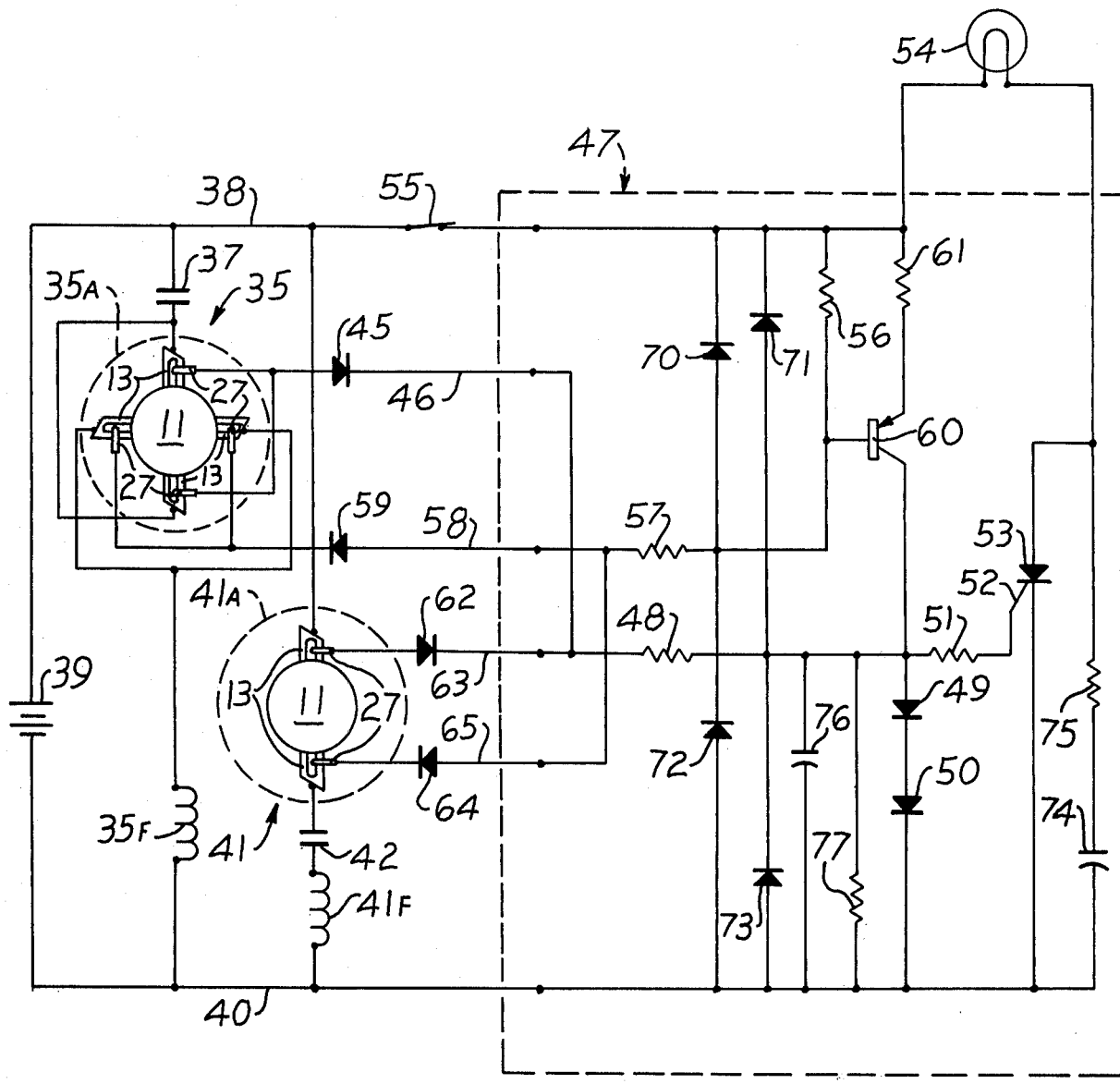
FIG. 7 is a circuit diagram of an indicator system for indicating wear of any brush which the machines are running.

FIG. 7 illustrates an arrangement wherein the described brushes and probes may be used in a system having a plurality of direct current machines to provide a warning indication during operation of the machines that one of the brushes has worn to an extent requiring replacement.

Machine 35 is typical of a multi-polar direct current motor wherein brushes of like polarity are electrically connected together. In this example, the brushes 13 of positive polarity connect armature 35A and commutator 11 through closable contacts 37 (which may be contacts of a switch or of a relay) to positive line 38 of the external power circuit and thus to a source of direct current, such as battery 39. The negative polarity brushes connect through the field winding 35F to the negative line 40 of the external power circuit.

Machine 41 is typical of a two-pole direct current motor with armature 41A and commutator 11 and field winding 41F and wherein the positive polarity brush connects directly to the positive power line 38 while the negative polarity brush connects through closable contacts 42 to the negative power line 40.

If machines 35 and 41 are driven as generators, instead of being powered as motors, battery 39 would be replaced be a suitable current load.

If contacts 37 are closed and machine 35 is running, and if any of the positive polarity brushes 13 should wear to the extent that the probe 27 associated therewith engages the terminating end of the groove therein, the probe will be connected to the positive line 38 through contacts 37 and the probe in question. Current can now flow through the current path comprising isolation diode 45 and line 46 to control circuit 47, then through resistor 48 and diodes 49 and 50 to negative power line 40. The combined forward voltage drop across diodes 49 and 50 is applied through resistor 51 to gate 52 of silicon controlled rectifier (SCR) 53 to gate it into conduction. Current now flows through indicator light 54 to provide a warning signal to the operator that a brush needs replacement. Flickering of the light 54 is prevented since the SCR 53 will remain in conduction when once gated on even though the probe may momentarily disengage from the brush and interrupt the gating signal. Similarly, light 54 will remain lit if contacts 37 are opened and current ceases to flow through the above current path. SCR 53 thus functions as a normally open switch which, when gated into conduction, will close and remain closed even through the gating condition ceases. Light 54 may be turned off by removing the power therefrom, as by opening the normally closed switch 55.

If any of the negative-polarity brushes 13 of motor 35 should wear to the extent that the probe 27 associated therewith engages the terminating end of the groove therein, the probe will be connected through the brush in question and field winding 35F to negative line 40. Current can now flow from positive line 38 through the current path comprising resistor 56, resistor 57, and line 58 from the control circuit 47 to and through isolation diode 59 to the probe associated with the worn negative polarity brush. The drop across resistor 56 will turn on transistor 60 so that current can flow through resistor 61, transistor 60 and the diodes 49 an 50. Again, the combined forward drop through diodes 49 and 50 will gate SCR 53 on and cause the indicator light 54 to be lit. Thus, transistor 60 provides a means whereby a low voltage signal at one of the probes is inverted and a high-voltage gating signal is applied to SCR 53.

The probes of machine 41 are connected to control circuit 47 in the same manner, i.e., the probe 27 associated with the positive-polarity brush is connected through isolation diode 62 and line 63 to resistor 48 while the probe associated with the negative-polarity brush is connected through isolation diode 64 and line 65 to resistor 57 in the control circuit 47. Again, if the positive-polarity brush should wear and engage the probe 27 associated therewith the current through the flow path from the probe to the negative power line will cause a voltage drop across diodes 49 and 50 to be developed and applied to SCR 53 to gate it into conduction. If the negative-polarity brush should wear and engage the probe associated therewith, the current through the flow pathe from the positive power line to the probe will cause a voltage drop across resistor 56 to be developed which turns transistor 60 on to in turn cause a voltage drop across diodes 49 and 50 to be developed and applied to the gate of SCR 53.

In the circuit of FIG. 7, brush wear will be detected and indicator light 54 lit when any brush is worn and while the machines 35 and 41 are in operation. However, two lines are needed to connect the probes of each motor to the control circuit 47, i.e., lines 46 and 58 from motor 35 and lines 63 and 65 from motor 41.

FIG. 8 illustrates a circuit arrangement wherein only a single line is used between each motor and control circuit 47. The circuit of FIG. 8 differs from that of FIG. 7 in that line 46 and diode 45 of FIG. 7, connecting the positive-polarity brush probes to control circuit 47, are removed, and the positive-polarity brush probes are instead connected by isolation diode 66 to diode 59. Thus, the positive-polarity brush probes are connected to the negative-polarity brush probes by back-to-back diodes 66 and 59. The cathodes of these diodes are connected to the probes, the anodes are connected to each other, and a single line 58 from the junction 67 between the diodes is used to connect the probes to the control circuit.

If the motor 35 is running and a negative-polarity brush wears, current through resistors 56, 57, line 58 and diode 59 will occur as before, transistor 60 will turn on, SCR 53 will be gated on and indicator light 54 will be energized, as before.

If the motor 35 is running and a positive-polarity brush wears, no current will flow as above described since the probe associated with the positive-polarity brush will be connected through contacts 37 to positive power line 38 and diode 66 will be back-biased. However, when contacts 37 are opened, and the motor stops, the high voltage at the positive-polarity brushes will cease and the brushes will be connected to the negative power line through the resistance of the armature 35A and field 35F. The now low potential at the worn positive-polarity brush and probe in contact therewith causes current to flow through the current path comprised of resistors 56 and 57, line 58 and diode 66 so that transistor 60 and SCR 53 are turned on and light 54 is lit as before.

The back-to-back arrangement of diodes 66 and 59 allows current to flow from junction 67 to any of the probes while isolating the brushes of opposite polarity so that the armature will not be shorted out in the event that probes associated with the positive- and negative-polarity brushes should engage both such brushes.

With regard to machine 41, diode 64 and line 65 of FIG. 7 are omitted, and the positive- and negative-polarity brush probes are connected together by back-to-back diodes 62 and 68, line 63 being connected to the junction 69 of the diodes. The cathodes of diodes 62 and 68 are connected together and their anodes are connected to the probes.

As before, if the positive-polarity brush wears, current will flow through diode 62 to junction 69 and through line 63 to the control circuit, causing SCR 53 to be gated on. If the motor 41 is running, wear of a negative-polarity brush will not cause SCR 53 to be gated on since no current will flow through diode 68. If contacts 42 are opened and the motor stops, the negative-polarity brush will be connected to the positive line 38 so that current will flow through diode 68 to junction 69 and through line 63 to the control circuit so that a gating voltage will be developed across diodes 49 and 50.

Although the single line connection of FIG. 8 from the machines to the control circuit 47 will not provide a warning of brush wear of all brushes until the machines are shut down, this is of little concern in systems such as those wherein motors are operated intermittently and run for only a relatively short time before they are turned off, as, for example, in lift truck operations. Brush wear of any brush will be indicated once the motor is turned off and the SCR 53 and light 54 will remain on even though the motor is then turned back on.

The control circuit 47 of both FIGS. 7 and 8 is provided with usual components for suppressing positive and negative transient voltage spikes in the transistor and SCR circuits. Diodes 70, 71 and 72 protect the base-emitter, collector-emitter and base-collector circuits of transistor 60 against transients. Diode 73 protects the gate-cathode circuit of SCR 53 against negative transients. In addition to providing a gating voltage by their combined forward drop, diodes 49 and 50 protect the gate-cathode circuit of SCR 53 against positive transients. Capacitor 74 and resistor 75 protect the anode-cathode circuit of SCR 54 against transients. Capacitor 76 acts as a sink to prevent turn-on of SCR 53 by sudden application of power to the circuit, resistor 77 providing a discharge path for capacitor 76 which otherwise would retain a charge equal to the voltage drop across the diodes 49 and 50.

Although FIGS. 7 and 8 disclose the use of a single indicator light for a plurality of motors, it is of course possible to use a separate control circuit 47 and indicator light 54 for each motor.

What is claimed is:

1. In a brush wear indicator for a direct current machine having a rotating commutator, a yoke surrounding said commutator, a brush holder on said yoke and a carbon brush means mounted in said brush holder for translatory movement relative to said commutator, said brush means having a contact face spring-pressed against said commutator, the improvement comprising:
   said carbon brush means having an elongated groove formed in one side thereof, said groove having opposed sides and a bottom, said groove having a terminating end spaced from the end of said brush means away from said contact face, said groove extending from said terminating end towards said contact face;
   an electrically conductive probe mounted in fixed relation to said yoke and said brush holder and having an end portion extending into said groove, said end portion of said probe being spaced from the sides and bottom of said groove during translatory movement of said brush means but being engageable with said terminating end of said groove.

2. In a device as set forth in claim 1 the improvement further being that said brush means comprises two separate side-by-side brushes each spring-pressed towards said commutator, but only one of which has said groove engageable with a probe.

3. In a device as set forth in claim 1 wherein said end portion of said probe is resilient and laterally deflectable.

4. In a device as set forth in claim 1 wherein said end portion of said probe is resilient and laterally deflectable and wherein the force required to laterally deflect said end portion is less than the spring-pressed force on said brush means and further including means to limit lateral deflection of said end portion of said probe.

5. In a brush wear indicator for a direct current machine having a rotating armature and commutator, a yoke surrounding said commutator, a plurality of brush holders on said yoke, positive- and negative-polarity carbon brush means mounted in said brush holders for translatory movement relative to said commutator, said positive- and negative-polarity brush means each having a contact face spring-pressed against said commutator, said positive- and negative-polarity brush means being connectable respectively to positive and negative lines of an external power circuit, the invention comprising:

a. each said carbon brush means having an elongated groove formed in one side thereof, said groove having opposed sides and a bottom, said groove having a terminating end spaced from the end of said brush means away from said contact face, said groove extending from said terminating end towards said contact face, b. an electrically conductive probe for each brush means, each probe being mounted in fixed relation to said yoke and said brush holders and having an end portion extending into said groove of the brush means associated therewith, said end portion of said probe being spaced from the sides and bottom of said groove during translatory movement of said brush means but engageable with said terminating end of said groove, c. an electrically energizable signal device, d. means responsive to engagement of the terminating end of the groove of one of said brush means with the probe associated therewith for energizing said signal device from said power circuit.

6. In a system as set forth in claim 5, wherein said means (d) comprises:

i. an energizing circuit for said signal device, ii. a normally open switch means connected in said energizing circuit for completing said circuit when said switch means is closed, iii. means responsive to engagement of the terminating end of said brush means groove with the probe associated therewith for closing said switch means.

7. In a system as set forth in claim 5 wherein said means (d) comprises:

i. an energizing circuit for said signal device, ii. a normally open switch means connected in said energizing circuit for completing said circuit when said switch means is closed, iii. for each of said brush means, means forming a current path from one of said lines of said power circuit to the probe associated with said brush means to allow current to flow through said current path and said probe when said probe engages the terminating end of said brush means groove and said brush means is connected to the other of said lines of said power circuit, iv. means responsive to current flow through any one of said probes and the current path of said means (d)(ii) associated therewith for closing said switch means.

8. In a system as set forth in claim 7 wherein said means (d)(iii) includes a pair of diodes connected back-to-back with their cathodes connected together and the anode of one diode connected to said positive-polarity brush means and the anode of the other diode connected to said negative-polarity brush means and a current path from the cathodes of said diodes to said negative line of said power circuit, and further including closable contacts connected between said negative-polarity brush means and said negative line of said power circuit.

9. In a system as set forth in claim 7 wherein said means (d)(iii) includes a pair of diodes connected back-to-back with their anodes connected together and the cathode of one diode connected to said positive-polarity brush means and the cathode of the other diode connected to said negative-polarity brush means and a current path from the anodes of said diodes to said positive line of said power circuit, and further including closable contacts connected between said positive-polarity brush means and said positive line of said power circuit.

10. In a system as set forth in claim 6 wherein said means (d)(iii) includes a first current path from said positive line of said power circuit to the probe associated with said negative-polarity brush means and a second current path from said negative line of said power circuit to the probe associated with said positive-polarity brush means.

11. In a system as set forth in claim 5 wherein said means (d) comprises:

i. an energizing circuit for said signal device, ii. a silicon controlled rectifier connected in said energizing circuit for completing said circuit when said silicon controlled rectifier is gated into conduction, iii. for each of said brush means, means forming a current path from one of said lines of said power circuit to the probe associated with said brush means to allow current to flow through said current path and said probe when said probe engages the terminating end of said brush means groove and said brush means is connected to the other of said lines of said power circuit, iv. means responsive to current flow through any one of said probes and the current path of said means (d)(iii) associated therewith for developing and applying a voltage to the gate of said silicon controlled rectifier to gate it into conduction.

12. In a system as set forth in claim 11 wherein said means (d)(iii) includes a pair of diodes connected back-to-back with their cathodes connected together and the anode of one diode connected to said positive-polarity brush means and the anode of the other diode connected to said negative-polarity brush means and a current path from the cathodes of said diodes to said negative line of said power circuit, and further including closable contacts contacts connected between said negative-polarity brush means and said negative line of said power circuit.

13. In a system as set forth in claim 11 wherein said means (d)(iii) includes a pair of diodes connected back-to-back with their anodes connected together and the cathode of one diode connected to said positive-polarity brush means and the cathode of the other diode connected to said negative-polarity brush means and a current path from the anodes of said diodes to said positive line of said power circuit, and further including closable contacts connected between said positive-polarity brush means and said positive line of said power circuit.

14. In a system as set forth in claim 11, wherein said means (d)(iii) includes a first current path from said positive line of said power circuit to the probe associated with said negative-polarity brush means and a second current path from said negative line of said power circuit to the probe associated with said positive-polarity brush means and wherein said means (d)(iv) is responsive to current flow through either of said first or second current paths.

15. In a system as set forth in claim 5, wherein said means (d) comprises:
   i. an energizing circuit for said signal device,
   ii. a silicon controlled rectifier connected in said energizing circuit for completing said circuit when said silicon controlled rectifier is gated into conduction,
   iii. means responsive to the presence of a positive-polarity voltage appearing at one of said probes from the brush means associated with said probe for applying a positive gating voltage to the gate of said silicon controlled rectifier.

16. In a system as set forth in claim 5 wherein said means (d) comprises:
   i. an energizing circuit for said signal device,
   ii. a silicon controlled rectifier connected in said energizing circuit for completing said circuit when said silicon controlled rectifier is gated into conduction,
   iii. means responsive to the presence of a negative-polarity voltage appearing at one of said probes from the brush means associated with said probe for inverting said voltage and applying a positive gating voltage to the gate of said silicon controlled rectifier.

17. In a system as set forth in claim 5 wherein said means (d) comprises:
   i. an energizing circuit for said signal device,
   ii. a silicon controlled rectifier connected in said energizing circuit for completing said circuit when said silicon controlled rectifier is gated into conduction,
   iii. means responsive to the presence of a positive-polarity voltage appearing at one of said probes from the brush means associated with said prove for applying a positive gating voltage to the gate of said silicon controlled rectifier,
   iv. means responsive to the presence of a negative-polarity voltage appearing at one of said probes from the brush means associated with said probe for inverting said voltage and applying a positive gating voltage to the gate of said silicon controlled rectifier.

* * * * *